(12) United States Patent
Sun

(10) Patent No.: US 11,088,318 B2
(45) Date of Patent: Aug. 10, 2021

(54) SPIN ORBIT TORQUE MAGNETORESISTIVE DEVICES AND METHODS THEREFOR

(71) Applicant: Everspin Technologies, Inc., Chandler, AZ (US)

(72) Inventor: Jijun Sun, Chandler, AZ (US)

(73) Assignee: Everspin Technologies, Inc., Chandler, AZ (US)

(*) Notice: Subject to any disclaimer, the term of this patent is extended or adjusted under 35 U.S.C. 154(b) by 0 days.

(21) Appl. No.: 16/376,644

(22) Filed: Apr. 5, 2019

(65) Prior Publication Data

US 2019/0312198 A1    Oct. 10, 2019

Related U.S. Application Data

(60) Provisional application No. 62/653,796, filed on Apr. 6, 2018.

(51) Int. Cl.
| | | |
|---|---|---|
| *H01L 43/08* | (2006.01) | |
| *H01L 43/10* | (2006.01) | |
| *H01L 43/12* | (2006.01) | |
| *H01L 27/22* | (2006.01) | |

(52) U.S. Cl.
CPC .............. *H01L 43/08* (2013.01); *H01L 43/10* (2013.01); *H01L 43/12* (2013.01); *H01L 27/228* (2013.01)

(58) Field of Classification Search
CPC ....... H01L 43/08; H01L 33/10; H01L 27/222; H01L 27/228; H01L 43/10; H01L 43/12
See application file for complete search history.

(56) References Cited

U.S. PATENT DOCUMENTS

| | | | | |
|---|---|---|---|---|
| 2007/0297220 A1* | 12/2007 | Yoshikawa | .......... | H01F 10/3254 365/158 |
| 2009/0218645 A1* | 9/2009 | Ranjan | .................. | G11C 11/161 257/421 |
| 2012/0280336 A1* | 11/2012 | Jan | .......................... | H01L 43/12 257/421 |
| 2016/0133307 A1* | 5/2016 | Lee | ......................... | H01L 43/10 257/421 |
| 2016/0300999 A1 | 10/2016 | Yi et al. | | |
| 2018/0019388 A1 | 1/2018 | Fukami et al. | | |
| 2019/0088713 A1* | 3/2019 | Swerts | ................ | H01F 10/3295 |
| 2020/0266341 A1* | 8/2020 | Hsu | .......................... | H01L 43/12 |

OTHER PUBLICATIONS

International Search Report in PCT/US2019/026085, dated Oct. 24, 2019 (5 pages).

* cited by examiner

*Primary Examiner* — Matthew E Warren
(74) *Attorney, Agent, or Firm* — Bookoff McAndrews PLLC

(57) ABSTRACT

Spin-orbit-torque (SOT) lines are provided near free regions in magnetoresistive devices that include magnetic tunnel junctions. Current flowing through such SOT lines injects spin current into the free regions such that spin torque is applied to the free regions. The spin torque generated from a SOT switching line can be used to switching the free region or to act as an assist to spin-transfer torque generated by current flowing vertically through the magnetic tunnel junction, in order to improve the reliability, endurance, or both of the magnetoresistive device. Further, one or more additional layers or regions may improve the SOT switching efficiency and the thermal stability of magnetoresistive devices including SOT lines.

20 Claims, 6 Drawing Sheets

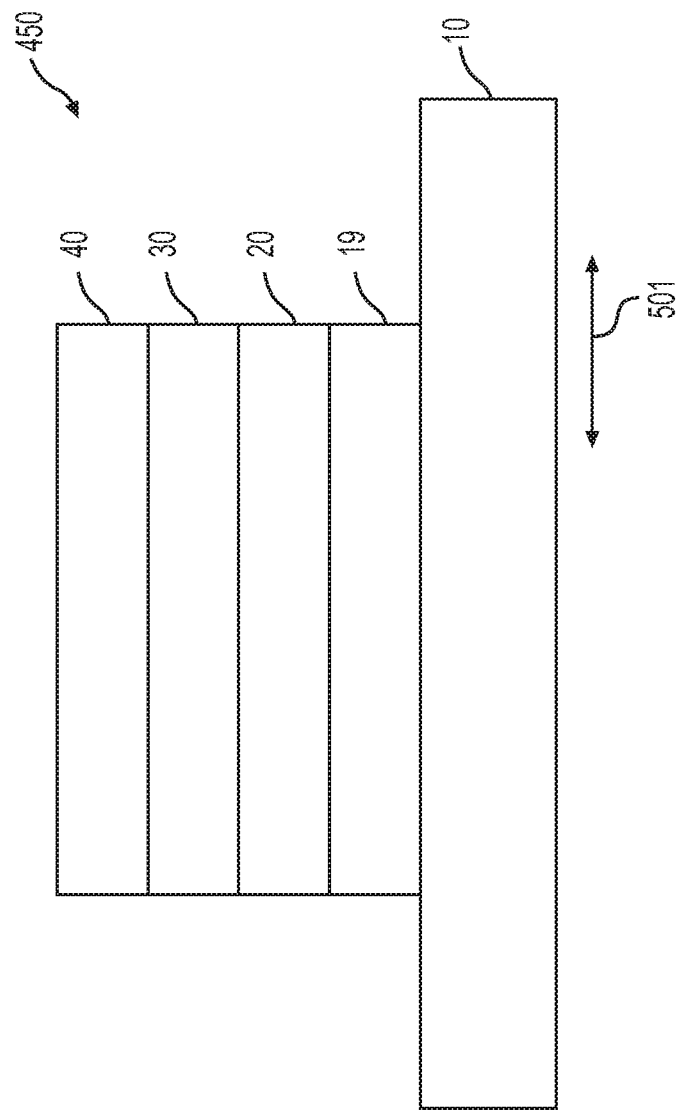

SPIN ORBIT TORQUE MAGNETORESISTIVE DEVICES AND METHODS THEREFOR

CROSS-REFERENCE TO RELATED APPLICATIONS

This application claims the benefit of priority from U.S. Provisional Application No. 62/653,796, filed on Apr. 6, 2018, which is incorporated by reference herein in its entirety.

TECHNICAL FIELD

The present disclosure relates to, among other things, magnetoresistive devices and methods for fabricating and/or using the disclosed magnetoresistive devices.

INTRODUCTION

There are many inventions described and illustrated herein, as well as many aspects and embodiments of those inventions. In one aspect, the present disclosure relates to a magnetoresistive device having a magnetoresistive stack or structure (for example, part of a magnetoresistive memory device, magnetoresistive sensor/transducer device, etc.) and methods of manufacturing the described magnetoresistive devices. In one embodiment, an exemplary magnetoresistive stack (for example, used in a magnetic tunnel junction (MTJ) magnetoresistive device) of the present disclosure includes one or more layers of magnetic or ferromagnetic material.

Briefly, a magnetoresistive stack used in a memory device (e.g., a magnetoresistive random access memory (MRAM)) includes at least one non-magnetic layer (for example, at least one dielectric layer or a non-magnetic yet electrically conductive layer) disposed between a "fixed" magnetic region and a "free" magnetic region, each including one or more layers of ferromagnetic materials. Information is stored in the magnetoresistive memory stack by switching, programming, and/or controlling the direction of magnetization vectors in the magnetic layer(s) of the "free" magnetic region. The direction of the magnetization vectors of the "free" magnetic region may be switched and/or programmed (for example, through spin orbit torque (SOT) or spin transfer torque (STT)) by application of a write signal (e.g., one or more current pulses) adjacent to, or through, the magnetoresistive memory stack. In contrast, the magnetization vectors in the magnetic layers of a "fixed" magnetic region are magnetically fixed in a predetermined direction. When the magnetization vectors of the "free" magnetic region adjacent to the non-magnetic layer are in the same direction as the magnetization vectors of the "fixed" magnetic region adjacent to the non-magnetic layer, the magnetoresistive memory stack has a first magnetic state. Conversely, when the magnetization vectors of the "free" magnetic region adjacent to the non-magnetic layer are opposite the direction of the magnetization vectors of the "fixed" magnetic region adjacent to the non-magnetic layer, the magnetoresistive memory stack has a second magnetic state. The magnetoresistive memory stack has different electrical resistances in the first and second magnetic states. For example, a resistance of the second magnetic state may be relatively higher than a resistance of the first magnetic state. The magnetic state of the magnetoresistive memory stack is determined or read based on the resistance of the stack in response to a read current applied, for example, through the magnetoresistive stack.

The present disclosure is directed to, among other things, devices and methods for writing or otherwise switching the magnetic state of a magnetoresistive memory device via an SOT switching scheme. More particularly, the description that follows describes embodiments of an SOT current carrying line configured to provide improved SOT switching efficiency. The scope of the current disclosure, however, is defined by the attached claims, and not by any characteristics of the resulting device or method.

BRIEF DESCRIPTION OF THE DRAWINGS

Embodiments of the present disclosure may be implemented in connection with aspects illustrated in the attached drawings. These drawings show different aspects of the present disclosure and, where appropriate, reference numerals illustrating like structures, components, materials, and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure and/or manner of construction of the various embodiments described herein. For ease of illustration, the figures depict the different layers/regions of the illustrated magnetoresistive stacks as having a uniform thickness and well-defined boundaries with straight edges. However, a person skilled in the art would recognize that, in reality, the different layers typically have a non-uniform thickness. And, at the interface between adjacent layers, the materials of these layers alloy together, or migrate into one or the other material, making their boundaries ill-defined. Descriptions and details of well-known features (e.g., interconnects, etc.) and techniques may be omitted to avoid obscuring other features. Elements in the figures are not necessarily drawn to scale. The dimensions of some features may be exaggerated relative to other features to improve understanding of the exemplary embodiments. Cross-sectional views are simplifications provided to help illustrate the relative positioning of various regions/layers and describe various processing steps. One skilled in the art would appreciate that the cross-sectional views are not drawn to scale and should not be viewed as representing proportional relationships between different regions/layers. Moreover, while certain regions/layers and features are illustrated with straight 90-degree edges, in actuality or practice such regions/layers may be more "rounded" and/or gradually sloping.

Further, one skilled in the art would understand that, although multiple layers with distinct interfaces are illustrated in the figures, in some cases, over time and/or exposure to high temperatures, materials of some of the layers may migrate into or interact with materials of other layers to present a more diffuse interface between these layers. It should be noted that, even if it is not specifically mentioned, aspects described with reference to one embodiment may also be applicable to, and may be used with, other embodiments.

Moreover, there are many embodiments described and illustrated herein. The present disclosure is neither limited to any single aspect nor embodiment thereof, nor to any combinations and/or permutations of such aspects and/or embodiments. Moreover, each aspect of the present disclosure, and/or embodiments thereof, may be employed alone or in combination with one or more of the other aspects of the present disclosure and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended to reflect or indicate that the embodiment(s) is/are "example" embodiment(s). Further, even though the figures and this written disclosure appear to describe the magnetoresistive stacks of the disclosed magnetoresistive devices in a particular order of construction (e.g., from bottom to top), it is understood that the depicted magnetoresistive stacks may have a different order (e.g., the opposite order (i.e., from top to bottom)).

Figure 1A:
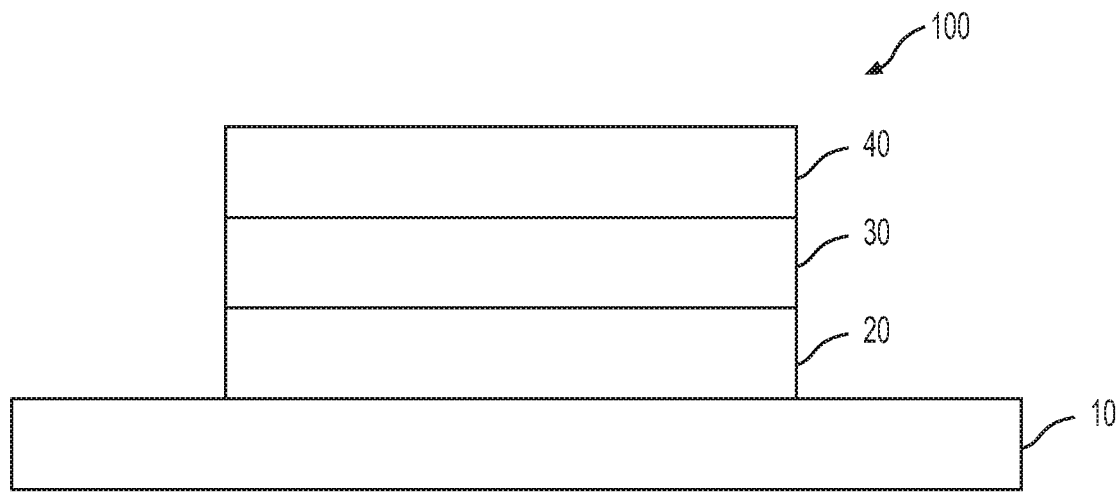
Figure 1B:
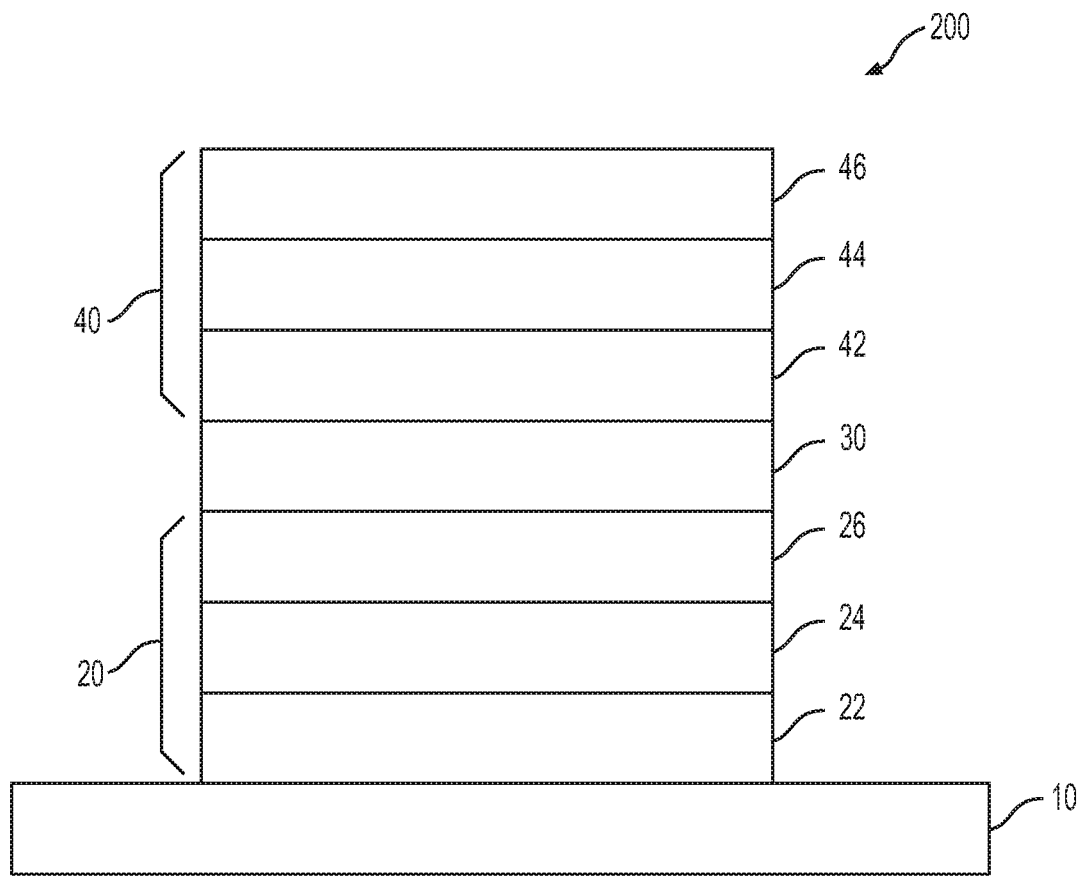
Figure 2A:
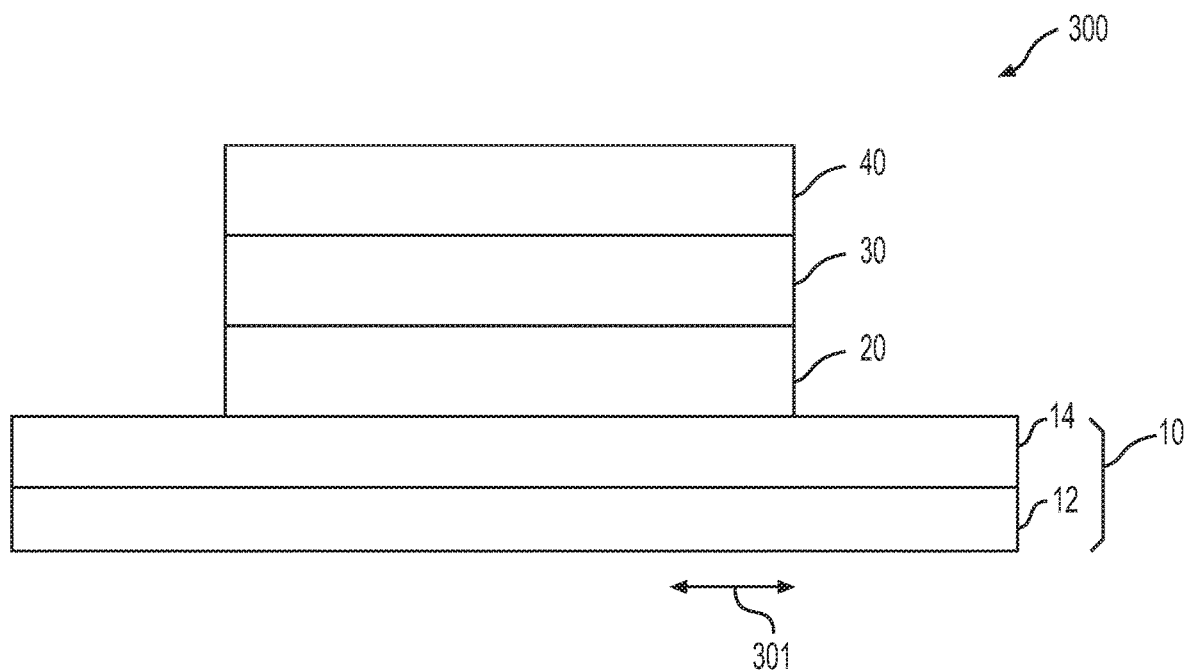
Figure 2B:
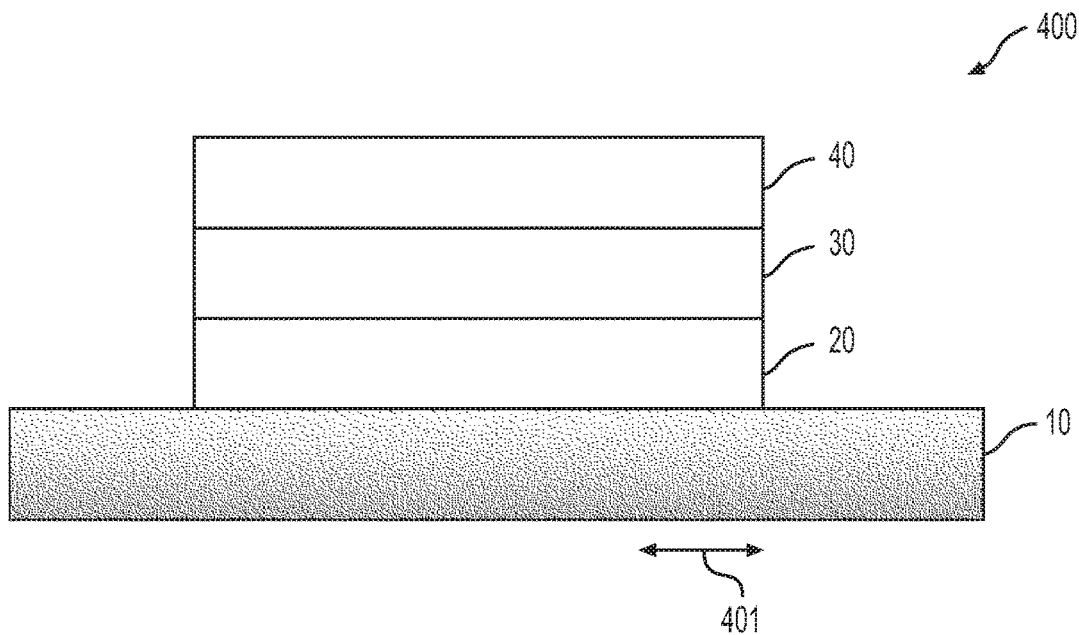
Figure 4:
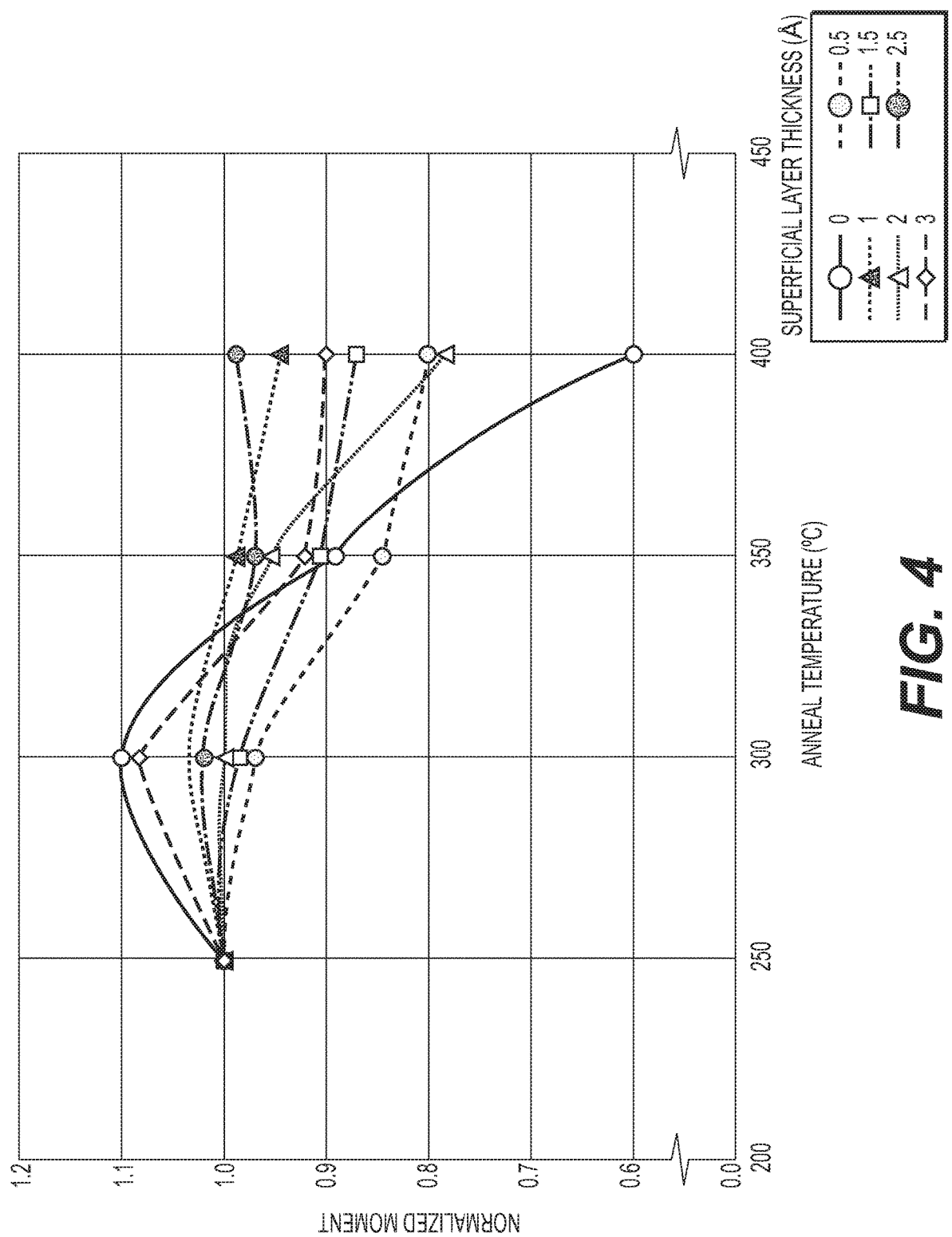
Figure 5:
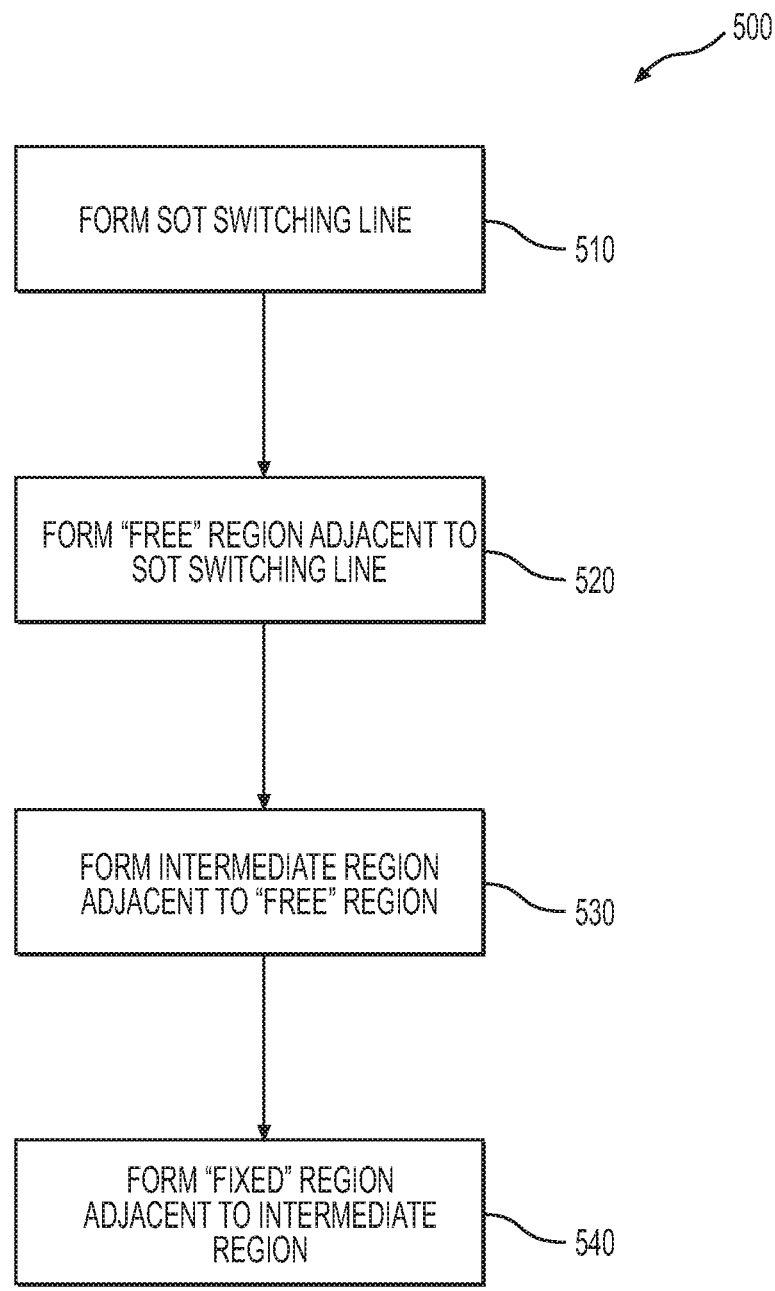
Figure 7A:
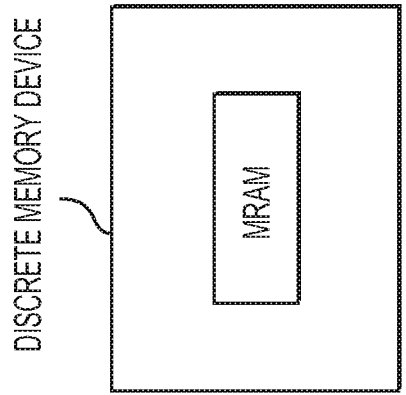
Figure 7B:
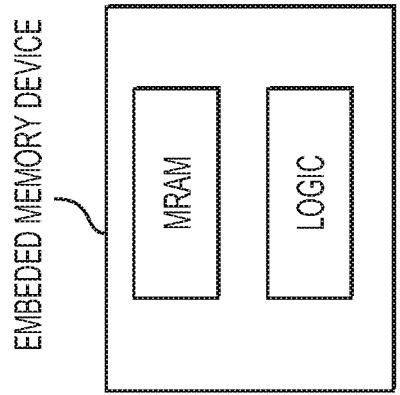
Figure 6:
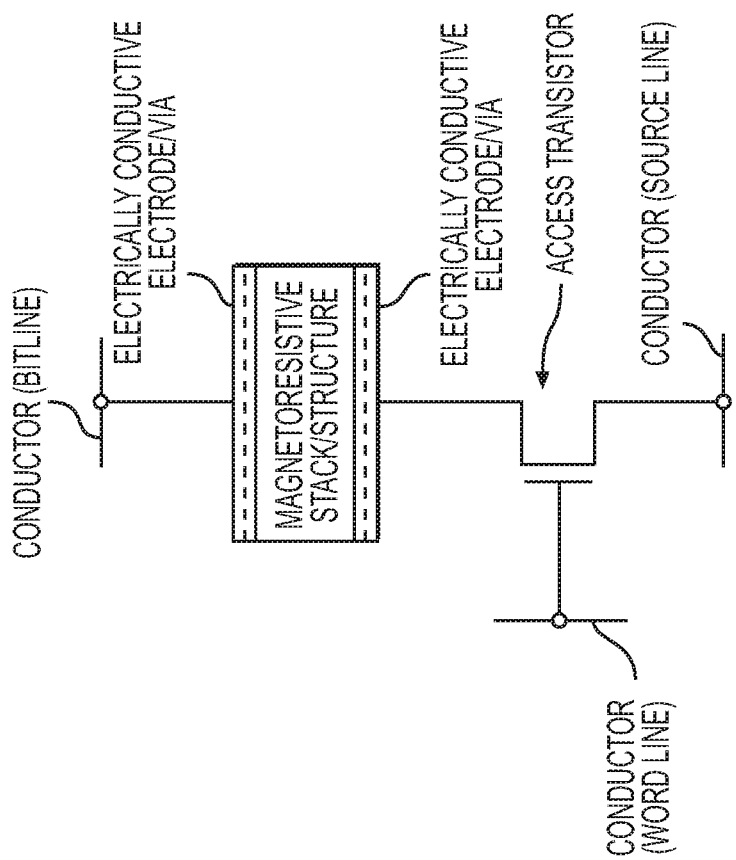

FIGS. 1A-1B illustrate cross-sectional views depicting various regions of exemplary magnetoresistive stacks;

FIG. 2A illustrates a cross-sectional view depicting an example magnetoresistive stack along with an exemplary SOT switching line configuration, according to an embodiment of the present disclosure;

FIG. 2B illustrates a cross-sectional view depicting an example magnetoresistive stack along with an exemplary SOT switching line configuration, according to a further embodiment of the present disclosure;

FIG. 3 illustrates a cross-sectional view depicting an example magnetoresistive stack along with an exemplary SOT switching line configuration, according to an embodiment of the present disclosure;

FIG. 4 is a plot of normalized magnetic moment as a function of annealing temperature for several exemplary magnetoresistive stacks, according to an embodiment of the present disclosure;

FIG. 5 is a simplified exemplary manufacturing flow for the fabrication of one or more exemplary magnetoresistive stacks;

FIG. 6 is a schematic diagram of an exemplary magnetoresistive memory stack eclectically connected to an access transistor in a magnetoresistive memory cell configuration; and FIGS. 7A-7B are schematic block diagrams of integrated circuits including a discrete memory device and an embedded memory device, each including an MRAM (which, in one embodiment, is representative of one or more arrays of MRAM having a plurality of magnetoresistive memory stacks according to aspects of certain embodiments of the present disclosure).

Again, there are many embodiments described and illustrated herein. The present disclosure is neither limited to any single aspect nor embodiment thereof, nor to any combinations and/or permutations of such aspects and/or embodiments. Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

DETAILED DESCRIPTION

It should be noted that all numeric values disclosed herein (including all disclosed thickness values, limits, and ranges) may have a variation of ±10% (unless a different variation is specified) from the disclosed numeric value. For example, a layer disclosed as being "t" units thick can vary in thickness from (t−0.1t) to (t+0.1t) units. Further, all relative terms such as "about," "substantially," "approximately," etc. are used to indicate a possible variation of ±10% (unless noted otherwise or another variation is specified). Moreover, in the claims, values, limits, and/or ranges of the thickness and atomic composition of, for example, the described layers/regions, mean the value, limit, and/or range±10%.

It should be noted that the description set forth herein is merely illustrative in nature and is not intended to limit the embodiments of the subject matter, or the application and uses of such embodiments. Any implementation described herein as exemplary is not to be construed as preferred or advantageous over other implementations. Rather, the term "exemplary" is used in the sense of example or "illustrative," rather than "ideal." The terms "comprise," "include," "have," "with," and any variations thereof are used synonymously to denote or describe a non-exclusive inclusion. As such, a device or a method that uses such terms does not include only those elements or steps, but may include other elements and steps not expressly listed or inherent to such device and method. Further, the terms "first," "second," and the like, herein do not denote any order, quantity, or importance, but rather are used to distinguish one element from another. Similarly, terms of relative orientation, such as "top," "bottom," etc. are used with reference to the orientation of the structure illustrated in the figures being described. Moreover, the terms "a" and "an" herein do not denote a limitation of quantity, but rather denote the presence of at least one of the referenced item.

In this disclosure, the term "region" is used generally to refer to one or more layers. That is, a region (as used herein) may include a single layer (deposit, film, coating, etc.) of material or multiple layers of materials stacked one on top of another (i.e., a multi-layer structure). Further, although in the description below, the different regions and/or layers in the disclosed magnetoresistive stacks may be referred to by specific names (e.g., capping region, reference region, transition region, etc.), this is only for ease of description and not intended as a functional description of the layer. Moreover, although the description below and the figures appear to depict a certain orientation of the layers relative to each other, those of ordinary skill in the art will understand that such descriptions and depictions are only exemplary. For example, though the "free" region is depicted as being "below" an intermediate region, in some aspects the entire magnetoresistive stack may be flipped such that the "free" region is "above" the intermediate region. In those aspects, e.g., the SOT current carrying line may be positioned adjacent "free" region accordingly.

In one exemplary aspect, the magnetoresistive stack of a magnetoresistive device of the present disclosure may be implemented as a spin-orbit torque (SOT) magnetoresistive random access memory ("MRAM") element ("memory element"). In such aspects, the magnetoresistive stack may include an intermediate region positioned (or sandwiched) between two ferromagnetic regions to form a magnetic tunnel junction (MTJ) device or an MTJ-type device. The intermediate region may be a tunnel barrier and include an insulating material, such as, e.g., a dielectric material. In other embodiments, the intermediate region may be a conductive material, e.g., copper, gold, or alloys thereof. In these other embodiments, where the magnetoresistive stack includes a conductive material in between two ferromagnetic regions, the magnetoresistive stack may form a giant magnetoresistance (GMR) or GMR-type device. Although the description below may refer to the magnetoresistive device as an MTJ device having an MTJ stack or structure, it should be noted that this is only exemplary. In some embodiments, magnetoresistive devices may include anisotropic magnetoresistive (AMR) devices or AMR-type devices. In general, the magnetoresistive devices of the current disclosure may also include other types of magnetoresistive devices (e.g., GMR-type device, AMR-type device, etc.).

Of the two ferromagnetic regions disposed on either side of the intermediate region, one ferromagnetic region may be a magnetically "fixed" (or pinned) region, and the other ferromagnetic region may be a magnetically "free" region. The term "free" is intended to refer to ferromagnetic regions having a magnetic moment that may shift or move significantly in response to applied magnetic fields or spin-polarized currents used to switch the magnetic moment vector. On the other hand, the words "fixed" and "pinned" are used to refer to ferromagnetic regions having a magnetic moment vector that does not move substantially in response to such applied magnetic fields or spin-polarized currents. As is known in the art, an electrical resistance of the described magnetoresistive stack may change based on whether the magnetization direction (e.g., the direction of the magnetic moment) of the "free" region adjacent to the non-magnetic layer (e.g., a tunnel barrier) is in a parallel alignment or in an antiparallel alignment with the magnetization direction (e.g., the direction of the magnetic moment) of the "fixed" region adjacent to the non-magnetic layer. Typically, if the two regions have the same magnetization alignment, the resulting relatively low resistance is considered as a digital "0," while if the alignment is antiparallel the resulting relatively higher resistance is considered to be a digital "1." A memory device (such as an MRAM) may include multiple such magnetoresistive stacks, which may be referred to as memory cells or elements, arranged in an array of columns and rows. By measuring the current through each cell, the resistance of each cell, and thus the data stored in the memory array, can be read.

In a spin-orbit torque (SOT) magnetoresistive device, switching the magnetization direction of the "free" region of a magnetoresistive stack may be accomplished by driving a current pulse through a switching line proximate (e.g., in contact with) the "free" region. The polarity of the current pulse determines the final magnetization state (i.e., parallel or antiparallel) of the "free" region. The mean current required to switch the magnetic state of the "free" region may be referred to as the critical current. The critical current is indicative of the current required to "write" data in (or the write current of) a magnetoresistive memory cell. Reducing the required write current(s) is desirable so that, among other things, a smaller access transistor can be used for each memory cell and a higher density, lower cost memory can be produced. Reduced write current requirements may also lead to greater longevity of a magnetoresistive memory cell.

Embodiments described herein utilize what is often referred to as spin-orbit torque (SOT) current to switch or aid in switching the magnetic state of the "free" region in an MTJ device, where such an MTJ device is often included in a memory cell in a magnetic memory. Current through a conductor (referred to as a switching line) adjacent to (e.g., in contact with) the "free" region results in a spin torque acting on the "free" region due to the injection of a spin current into the "free" region from spin-dependent scattering of electrons in the conductor. The spin current is injected into the "free" region in a direction perpendicular to the boundary (or interface) where the "free" region and the conductor meet. The spin torque applied to the "free" region by the spin current impacts the magnetic state of the "free" region in a similar manner as spin-polarized tunneling current that flows through the MTJ in a spin-torque (or spin-transfer-torque (STT)) magnetic tunnel junctions.

As with write currents in spin-torque MTJ devices, in SOT MTJ devices, the direction of the torque applied by the spin current is dependent on the direction of the current flow in the switching line. In other words, the direction of the current flow through the conductor adjacent to the "free" region determines the direction of the torque that is applied to the "free" region. As such, the "free" region can be switched between two stable states based on torque applied by current flowing in the neighboring switching line in one direction or the other.

In some embodiments, the torque applied by the spin current alone is used to switch the "free" region into a particular magnetic state, whereas in other embodiments, the spin current works as an "assist" to reduce the magnitude of a spin-torque write current required to switch the magnetic state of the "free" region, where the spin-torque write current travels through the entirety of the MTJ stack to produce a spin polarized tunneling current between the "free" region and "fixed" region. Reading of data stored by the MTJ stack may be accomplished as in a typical spin-torque MTJ device. For example, a read current, which has a lesser magnitude than that of a spin-transfer torque write current required to switch the "free" region, is applied to the MTJ stack to sense the resistance of the MTJ stack. As a person of ordinary skill in the art would recognize, there are many techniques that may be used to detect or sense the resistance of the MTJ stack. In some embodiments, the resistance sensed based on the read current can be compared with a reference resistance to determine the state of the "free" region. In some embodiments, a self-referenced read operation is performed where the resistance through the MTJ is sensed, then the MTJ is written (or reset) so that the "free" region is in a known state, then the resistance is sensed again and compared with the resistance originally sensed. The original state of the "free" region can then be determined based on whether the resistance sensed has changed based on the write or reset operation. In still other embodiments, a mid-point reference read operation may be performed.

For the sake of brevity, conventional techniques related to semiconductor processing may not be described in detail herein. The exemplary embodiments may be fabricated using known lithographic processes. The fabrication of integrated circuits, microelectronic devices, micro electro mechanical devices, microfluidic devices, and photonic devices involves the creation of several layers or regions (i.e., comprising one or more layers) of materials that interact in some fashion. One or more of these regions may be patterned so various regions of the layer have different electrical or other characteristics, which may be interconnected within the region or to other regions to create electrical components and circuits. These regions may be created by selectively introducing or removing various materials. The patterns that define such regions are often created by lithographic processes. For example, a layer of photoresist is applied onto a layer overlying a wafer substrate. A photo mask (containing clear and opaque areas) is used to selectively expose the photoresist by a form of radiation, such as ultraviolet light, electrons, or x-rays. Either the photoresist exposed to the radiation, or not exposed to the radiation, is removed by the application of a developer. An etch may then be employed/applied whereby the layer (or material) not protected by the remaining resist is patterned. Alternatively, an additive process can be used in which a structure is built up using the photoresist as a template.

As noted above, in one aspect, the described embodiments relate to, among other things, methods of manufacturing a magnetoresistive stack having one or more electrically conductive electrodes, vias, or conductors on either side of a magnetic material stack. As described in further detail below, the magnetic material stack may include many different regions of material, where some of these regions include magnetic materials, whereas others do not. In one embodiment, the methods of manufacturing include sequentially depositing, growing, sputtering, evaporating, and/or providing (as noted above, herein collectively "depositing" or other verb tense (e.g., "deposit" or "deposited")) regions which, after further processing (for example, etching) form a magnetoresistive stack.

In some embodiments, the disclosed magnetoresistive stacks may be formed between a top electrode/via/line and a bottom electrode/via/line and, which permit access to the stack by allowing for connectivity (for example, electrical) to circuitry and other elements of the magnetoresistive device. Between the electrodes/vias/lines are multiple regions, including at least one "fixed" magnetic region (referred to hereinafter as a "fixed" region) and at least one "free" magnetic region (referred to hereinafter as a "free" region) with one or more intermediate region(s), such as, e.g., a dielectric layer (that form(s) a tunnel barrier) between the "fixed" and "free" magnetic regions. Each of the "fixed" and "free" magnetic regions may include, among other things, a plurality of ferromagnetic layers. In some embodiments, the top electrode (and/or the bottom electrode) may be eliminated, and the bit line may be formed on top of the stack. Additionally, each stack may be disposed adjacent to an SOT switching line. The SOT switching line carries the switching current that imparts a spin current on the "free" region during write and reset operations. In at least one embodiment, the electrodes/vias/lines of the magnetoresistive stacks may comprise an SOT switching line. In other embodiments, a magnetoresistive stack is formed between a top electrode/via/line and a bottom electrode/via/line and further is adjacent to an SOT switching line, which may be independently connected to a current source. In such embodiments, the magnetoresistive device may be referred to as a "three-terminal" magnetoresistive device.

With reference now to FIG. 1A, there is depicted a cross-sectional view of an exemplary magnetoresistive stack 100 of the current disclosure. Magnetoresistive stack 100 may include, for example, an in-plane or out-of-plane magnetic anisotropy magnetoresistive stack (e.g., a perpendicular magnetic anisotropy magnetoresistive stack). Magnetoresistive stack 100 includes multiple regions (or layers) arranged one over the other to form a stack of regions above or otherwise adjacent to an SOT switching line 10. As would be recognized by a person of ordinary skill in the art, several other commonly-used regions or layers of magnetoresistive stack 100 (e.g., various protective cap layers, seed layers, underlying substrate, electrically conductive interconnects, etc.) have not been illustrated in FIG. 1A (and in subsequent figures) for clarity. Although not illustrated in FIG. 1A, in some embodiments, the magnetoresistive stack 100 may be formed on a planar surface of a semiconductor substrate (e.g., surface of a semiconductor substrate having electrical circuit elements (e.g., CMOS circuits, such as transistors, diodes, etc.) formed thereon or therein. The different regions of the multi-layer magnetoresistive stack 100 will be described below.

In some embodiments, as shown in at least FIG. 1A, the "free" region 20 may be deposited on (e.g., directly on) or otherwise adjacent to the SOT switching line 10. For instance, in some embodiments, one or more layers or regions of materials (e.g., interfacial regions, superficial layers, etc.) may be provided between the SOT switching line 10 and the "free" region 20. In some embodiments, the magnetoresistive stack 100 may include one or more magnetic interfacial layers (e.g., at the interface between switching line 10 and "free" region 20). During fabrication, the magnetic interfacial layer may assist in the formation of overlying regions (e.g., regions of the "free" region) on the switching line 10 and may promote or enhance the magnetic properties of the "free" region. The promoting or enhancing effect of a magnetic interfacial layer may improve SOT switching characteristics, such as, for example, an improved SOT switching efficiency. The magnetic interfacial layer may include one or more of nickel (Ni), cobalt (Co), iron (Fe), and alloys thereof (for example, an alloy including cobalt (Co) and iron (Fe)).

It should be noted that the construction/configuration of the "free" region 20 illustrated in at least FIG. 1A and described below is only exemplary, and many other constructions/configurations are possible. Notwithstanding the specific construction/configuration of the "free" region 20, as explained previously, a magnetic vector (or moment) in "free" region 20 may be moved or switched by applied magnetic fields or spin torque currents.

FIG. 1B illustrates another exemplary magnetoresistive stack 200 of the current disclosure having a different structure of "free" region 20. As illustrated in FIG. 1B, in some embodiments, the "free" region 20 may include one or more regions 22, 26 formed of a magnetic or ferromagnetic material separated by one or more insertion region(s) 24. The insertion region 24 may provide either ferromagnetic coupling or antiferromagnetic coupling between the ferromagnetic regions 22 and 26 of the "free" region 20. In some embodiments, the materials of ferromagnetic regions 22, 26 may include alloys of one or more of ferromagnetic elements, such as, nickel (Ni), iron (Fe), and/or cobalt (Co), and in some embodiments, boron (B). In some embodiments, the ferromagnetic regions 22, 26 may comprise an alloy including cobalt (Co), iron (Fe), and boron (B) (referred to as CoFeB). For ease of description, in the description below, ferromagnetic region 22 may be referred to as the first ferromagnetic region and ferromagnetic region 26 may be referred to as the second ferromagnetic region.

In some embodiments, one or both of the ferromagnetic regions 22, 26 may be formed by directly depositing a boron-containing ferromagnetic alloy (such as, for example, CoFeB). The exact composition of the CoFeB alloy may depend upon the application. In some embodiments, the CoFeB alloy may have a composition between approximately 10-50 atomic percent (at. %) of cobalt (Co), approximately 10-35 at. % of boron (B) and the remainder being iron (Fe), or preferably between approximately 20-40 at. % cobalt (Co), approximately 15-30 at. % boron (B), and the remainder being iron (Fe), or more preferably approximately 55% at. % iron (Fe), approximately 25 at. % boron (B), and the remaining cobalt (Co). In some embodiments, additional elements may be added to the CoFeB alloys of ferromagnetic regions 22, 26 to provide improved magnetic, electrical, or microstructural properties. In some embodiments, a thin layer of iron (e.g., approximately 1-3 Å thick) may also be provided at one or both the interfaces of the ferromagnetic regions 22, 26 with the intermediate region 30 or SOT switching line 10.

Insertion region 24 may include any nonmagnetic material (now known or developed in the future) that can provide coupling (e.g., ferromagnetic or antiferromagnetic) between the ferromagnetic regions on either side of the insertion region 24. That is, insertion region 24 may provide coupling between the ferromagnetic region 22 on the one side and the ferromagnetic region 26 on the other side. In some embodiments, the insertion region 24 may include materials such as tantalum (Ta), tungsten (W), hafnium (Hf), vanadium (V), titanium (Ti), molybdenum (Mo), ruthenium (Ru), rhodium (Rh), rhenium (Re), iridium (Ir), chromium (Cr), osmium (Os), and combinations thereof. Although "free" region 20 of FIG. 1B is illustrated as including two ferromagnetic regions 22, 26 separated by a single insertion region 24, this is only exemplary. In general, "free" region 20 may have any number of ferromagnetic regions 22, 26 with insertion regions 24 provided between the adjacent ferromagnetic regions.

In general, the ferromagnetic regions 22, 26 may have any thickness. In some embodiments, the thickness of the ferromagnetic regions 22, 26 may each be approximately 3-30 Å (preferably approximately 6-17 Å, or more preferably approximately 8-15 Å). The thickness of insertion region 24 is typically chosen to provide strong ferromagnetic or antiferromagnetic coupling between the ferromagnetic regions on either side of the insertion region 24. In general, the thickness of insertion region 24 may be chosen such that it does not form a continuous layer, which would break or otherwise inhibit the exchange coupling between adjacent ferromagnetic regions 22, 26. Instead, the material of insertion region 24 may mix with the materials of the adjacent ferromagnetic regions 22, 26 to form a uniform layer, or may form a layer that is not continuous, so that the adjacent ferromagnetic regions 22, 26 are directly exchange coupled to each other and the entire structure acts as a single ferromagnetic "free" region 20 of magnetoresistive stack 100. In general, the thickness of the insertion region 24 may be approximately 1-12 Å (preferably approximately 2-6 Å, or more preferably approximately 2.5-4 Å). In some embodiments, the as-deposited thickness of the insertion region 24 may be less than approximately 5 Å, or approximately 2 Å and 4.5 Å, or approximately 3 Å.

As referred to herein, the term "thickness" includes a deposited quantity of the indicated element or alloy. In some embodiments, the described thicknesses and compositions of the different regions are the target thicknesses and compositions of the sputter targets used in the deposition of the various layers and regions. As known to those of ordinary skill in the art, experimental variations in these thicknesses and compositions can be expected. Further, as known to those of ordinary skill in the art, over time exposure to high temperatures (such as, for example, during annealing, back end of line processing, or similar techniques common in the fabrication of memory devices), the materials of the various regions and layers may alloy with each other to form a more homogenous structure without distinct interfaces demarcating the different regions and layers. As a result of such alloying, over time, the regions of a magnetoresistive stack may have a composition that includes the materials of other layers. However, in some embodiments, an increased concentration of a material may still be noticeable at different parts (e.g., interfaces) of the region upon analysis.

With renewed reference to FIG. 1A, after forming the "free" region 20 as described above, an intermediate region 30 may be formed on or above the "free" region 20. In embodiments of magnetoresistive stack 100 used in an MTJ device, the intermediate region 30 may include a dielectric material and may function as a tunnel barrier. Although the intermediate region 30 may include any suitable dielectric material, in some embodiments, the intermediate region 30 may include magnesium oxide ($MgO_x$), aluminum oxide ($AlO_x$) (e.g., $Al_2O_3$), or a combination thereof. In general, the intermediate region 30 may have any thickness. In some embodiments, the intermediate region 30 may have a thickness of approximately 3-14.1 Å, preferably approximately 5.0-13.0 Å, and more preferably approximately 6-12.5 Å. Although not illustrated in the figures, in some embodiments, a dusting of an interfacial material (e.g., cobalt (Co), iron (Fe), or their alloys, etc.) may also be provided at the interface between the "free" region 20 and the intermediate region 30. This interfacial material, deposited as, e.g., a discontinuous patchwork of material (as opposed to a continuous layer that would break exchange between the mating layers), may result in a relatively high(er) perpendicular magnetic anisotropy (PMA) of the resulting magnetoresistive stack 100.

In general, the intermediate region 30 may be formed on or above the "free" region 20 using any technique now known (e.g., deposition, sputtering, evaporation, etc.) or later developed. In some embodiments, the intermediate region 30 may be formed by multiple steps of material deposition and oxidation. For example, a layer of an oxidizable material (e.g., magnesium (Mg), aluminum (Al), etc.) may first be deposited and the deposited layer of oxidizable material may be oxidized (using, for example, natural oxidation at temperatures less than or equal to about 35° C., plasma oxidation, etc.) to convert the oxidizable material to an oxide. In some embodiments, multiple such deposition and oxidation steps may be carried out to produce an intermediate region 30 of the desired thickness.

A "fixed" region 40 may be formed on (or above) the intermediate region 30. As explained previously, "fixed" region 40 may serve as a "fixed" magnetic region of magnetoresistive stack 100. That is, a magnetic moment vector in the "fixed" region 40 does not move significantly in response to applied magnetic fields (e.g., an external field) or applied currents used to switch the magnetic moment vector of the "free" region 20. It should be noted that the structure of the "fixed" region 40 illustrated in FIG. 1A is only exemplary. As known to those of ordinary skill in the art, many other configurations of the "fixed" region 40 also are possible. The magnetoresistive stack 200 of FIG. 1B illustrates the structure of another embodiment of the "fixed" region 40.

In some embodiments, "fixed" region 40 also may include one or more non-magnetic material layers. For example, ruthenium (Ru), rhodium (Rh), platinum (Pt), palladium (Pd), rhenium (Re), iridium (Ir), copper (Cu), aluminum (Al), tantalum (Ta), titanium (Ti), niobium (Nb), vanadium (V), zirconium (Zr), iridium (Ir), one or more alloys of these elements, and in certain embodiments, tungsten (W) and molybdenum (Mo). Referring to FIG. 1B, in one embodiment, the "fixed" region 40 may be a fixed, unpinned synthetic antiferromagnetic (SAF) region disposed on or above the intermediate region 30. The fixed, unpinned synthetic antiferromagnetic (SAF) region may include at least two magnetic regions 42, 46 (i.e., made of one or more layers) separated by a coupling region 44. The one or more of magnetic regions 42, 46 may include one or more of the ferromagnetic elements nickel (Ni), iron (Fe), and cobalt (Co), including alloys or engineered materials with one or more of the elements palladium (Pd), platinum (Pt), chromium (Cr), and alloys thereof. The coupling region 44 may be an antiferromagnetic (AF) coupling region that includes non-ferromagnetic materials such as, for example, iridium (Ir), ruthenium (Ru), rhenium (Re), or rhodium (Rh), chromium (Cr), hafnium (Hf). In some embodiments, one or both magnetic regions 42, 46 of the "fixed" region 40 may comprise a multi-layer magnetic structure that includes a plurality of layers of (i) a first ferromagnetic material (e.g., cobalt (Co)) and (ii) a second ferromagnetic material (e.g., nickel (Ni)) or a paramagnetic material (e.g., platinum (Pt)). In some embodiments, magnetic regions 42, 46 may also include, for example, alloys or engineered materials with one or more of palladium (Pd), platinum (Pt), magnesium (Mg), manganese (Mn), and chromium (Cr).

Additionally, or alternatively, in some embodiments, the "fixed" region 40 may include one or more synthetic ferromagnetic structures (SyF). Since SyFs are known to those skilled in the art, they are not described in greater detail herein. In some embodiments, the "fixed" region 40 may have a thickness in the range of approximately 8 Å and approximately 300 Å, between approximately 15 Å and approximately 110 Å, greater than or equal to 8 Å, greater than or equal to 15 Å, less than or equal to 300 Å, or less than or equal to 110 Å.

In some embodiments, the "fixed" region 40 may also include one or more additional layers, such as, for example, a transition region and a reference region, disposed at the interface between the magnetic region 42 and the intermediate region 30. The reference and/or transition regions may include one or more layers of material that, among other things, facilitate/improve growth of any overlying regions during fabrication of stack 200. In one embodiment, the reference region may comprise one or more (e.g., all) of cobalt (Co), iron (Fe), and boron (B) (for example, in an alloy—such as an amorphous alloy (e.g., CoFeB or CoFeBTa or CoFeTa)), and the transition region may include a non-ferromagnetic transition metal such as tantalum (Ta), titanium (Ti), tungsten (W), ruthenium (Ru), niobium (Nb), zirconium (Zr), and/or molybdenum (Mo). In general, the transition region and the reference region may have any thickness. In some embodiments, a thickness (t) of the reference region may be approximately 6-13 Å, preferably approximately 8-12 Å, and more preferably approximately 9-9.5 Å, and the thickness of the transition region may be approximately 1-8 Å, preferably approximately 1.5-5 Å, and more preferably approximately 2.5-3.5 Å. It should be noted that, in some embodiments of magnetoresistive stacks 100/200, both the above-described transition region and reference region may be provided in or otherwise as a part of the "fixed" region 40. In some embodiments, one or both of the transition region and the reference region may be eliminated from the "fixed" region 40 of the magnetoresistive stack 200.

"Fixed" region 40 may be deposited or formed using any technique now known or later developed, all of which are intended to fall within the scope of the present disclosure. In some embodiments, one or more of the magnetic regions of the "fixed" region 40 (e.g., regions 46, 42) may be deposited using a "heavy" inert gas (for example, xenon (Xe)), for example, at room temperature (for example, approximately 15-40° C., and more preferably approximately 20-30° C., and most preferably approximately 25° C. (+/−10%)) or a conventional/typical elevated temperature. In some embodiments, the AF coupling region 44 may also be deposited using a "heavy" inert gas (for example, xenon (Xe), argon (Ar), and/or krypton (Kr)) at such temperatures. In embodiments where the transition region and/or the reference region are provided, they may also be deposited using a "heavy" inert gas (for example, xenon (Xe), argon (Ar), and/or krypton (Kr)) at about room temperature (for example, 15-40° C., and more preferably approximately 20-30° C., and most preferably approximately 25° C. (+/−10%)) or an elevated temperature (e.g., approximately >40° C.).

The various regions of the "fixed" region 40 depicted in FIG. 1B may be deposited individually during a fabrication process. As explained previously with reference to the multiple layers of the "free" region 20 of FIG. 1B, in some embodiments, the materials that make up the various depicted regions of "fixed" region 40 may alloy together (intermix with, diffuse into, etc.) during a subsequent processing step such as, e.g., back-end of the line (BEOL) processing. Therefore, a person skilled in the art would recognize that, although the different regions (of "free" region 20 and "fixed" region 40 of FIG. 1B) may appear as separate regions with distinct interfaces immediately after formation of these regions, after subsequent processing operations, the materials of the different regions may alloy together to form a single alloyed "free" region 20 or "fixed" region 40 having a higher concentration of different materials at interfaces between different regions. Thus, in some cases, it may be difficult to distinguish the different regions of the "free" region 20, "fixed" region 40 (and other regions) in a finished magnetoresistive stack 200.

In some embodiments, for example, those shown in FIGS. 2A-3, an SOT switching line 10 may be provided adjacent to the "free" region 20 of the magnetoresistive stack 300, 400, 450. Current may be passed in either of two directions through the SOT switching line 10. More specifically, current may be passed in the directions indicated by arrows 301, 401, 501. The current may be passed through SOT switching line 10 in directions that are parallel to the surface forming the interface between the SOT switching line 10 and the "free" region 20 of each respective magnetoresistive stack 300, 400, 450. As discussed previously, the electrical current in the SOT switching line 10 induces or otherwise causes a spin current to enter the "free" region 20, where the spin current moves substantially perpendicular to the interface of the SOT switching line 10 and "free" region 20. The spin torque provided by the spin current can be used to switch or assist in switching the magnetic state of the "free" region 20. In some embodiments, when the "free" region 20 is to be written to a desired magnetic state (e.g., during write or reset operations), a current is established in one of two directions (indicated by arrows 301, 401, 501) in the SOT switching line 10. Current flowing in one direction forces the magnetization of the "free" region 20 to a first state (e.g., parallel or P state) and current flowing in the opposite direction forces the magnetization of the "free" region 20 to a second state (e.g., antiparallel or AP state).

In some embodiments, all of the spin torque required to set the magnetic state (P, AP, etc.) of the "free" region 20 is applied as a result of current in switching line 10 (e.g., no current flows through the intermediate region 30). Eliminating or minimizing current flow through the intermediate region 30 may reduce electrical, chemical, and/or physical stresses on the magnetoresistive stack 300, 400, 450. However, no current flow through the intermediate region 30 is not a requirement. In some embodiments, the spin torque induced by the spin current generated by applying a electrical current through SOT switching line 10 may not completely switch the magnetic state of the "free" region 20, but instead may apply enough spin torque to require a lesser amount of spin-torque write current (spin-transfer-torque) through the magnetoresistive stack 100 to cause the "free" region 20 to switch magnetic states. In such embodiments, the current passing through the SOT switching line 10 may only provide a fraction of the spin torque needed to change the magnetic state of the "free" region 20 and a spin-transfer-torque producing current may be passed through the magnetoresistive stack 100 to change the state of the "free" region 20.

In some embodiments, the SOT switching line 10 may be in contact (e.g., direct contact) with the "free" region 20. In some embodiments, SOT switching line 10 may contact the "free" region 20 via one or more interfacial layers. In some embodiments, such as, for example, those illustrated in FIGS. 2A and 2B, the SOT switching line 10 may contact substantially the entire surface of the "free" region 20 (e.g., forming a continuous line from one edge of the surface to another edge of the surface). However, in some embodiments, the SOT switching line 10 may only contact a portion of a surface of the "free" region 20. Increasing the area of contact between the SOT switching line 10 and the "free" region 20 may allow the spin current to be more efficiently introduced into the "free" region 20. In general, the magnetic field applied to "free" region 20, for example, due to the exchange coupling between the SOT switching line 10 and the "free" region 20 when the SOT switching line 10 is an antiferromagnetic material, may be such that a current flowing in the switching line 10 introduces a spin current or spin torque in the "free" region 20 that switches (or assists in switching) the magnetic state of the "free" region 20 to the preferred magnetic state (i.e. deterministic SOT switching). Moreover, although a single magnetoresistive stack 100, 200, 300, 400, 450 is depicted as being associated with SOT switching line 10, those of ordinary skill in the art will readily recognize that any suitable number of magnetoresistive stacks may be in contact (or otherwise associated) with SOT switching line 10.

Without being limited by theory, it is believed the current density within the SOT switching line 10 may determine the amount of spin current generated in the "free" region 20. As such, different geometries and compositions may be utilized to optimize the performance (e.g., improve switching efficiency) of the SOT switching line 10. In some embodiments of a magnetoresistive stack 300, such as the one depicted in FIG. 2A, the SOT switching line 10 may comprise a multi-layer (e.g., a bilayer) structure. In some such embodiments, one layer of the bilayer structure (for example, the "bottom" layer of the bilayer, as depicted in FIG. 2A), may comprise an antiferromagnetic layer 12 and the other layer (e.g., the "top" layer of the bilayer in contact with the "free" region 20) may comprise an interfacial layer 14. The interfacial layer 14 may be used to control the exchange coupling strength between the MTJ free region "20" and the antiferromagnetic layer 12 of SOT switching line 10. The bias field generated by exchange coupling between antiferromagnetic layer 12 and "free" region 20 may assist in ensuring that the "free" region switches to the proper magnetic state during an SOT write operation. As described previously, although the two layers 12, 14 of the bilayer structure may appear as distinct layers immediately after fabrication, in some embodiments (e.g., after subsequent high temperature processing operations), the materials of these layers 12, 14 may alloy together or migrate into each other at the interface between the two layers 12, 14. In some embodiments, the antiferromagnetic layer 12 may include alloys of manganese (Mn) and other transition metals, and the interfacial layer 14 may include a conductive material (e.g., iridium (Ir), palladium (Pd), platinum (Pt), hafnium (Hf), chromium (Cr), copper (Cu), gold (Au), tantalum (Ta), tungsten (W), gadolinium (Gd) or alloys thereof).

In some embodiments, the antiferromagnetic layer 12 comprises one or more alloys of manganese (Mn). Suitable manganese (Mn) alloys for the antiferromagnetic layer 12 include, but are not limited to, an iron manganese alloy (FeMn), a platinum manganese alloy (PtMn), an iridium manganese alloy (IrMn), a palladium manganese alloy (PdMn), a platinum palladium manganese alloy (PtPdMn), and a nickel manganese alloy (NiMn). In embodiments including PtMn, PdMn, FeMn, NiMn, or PdPtMn alloys, such alloys may have a manganese content in the range of approximately 40-60 atomic percent, or even approximately 45-55 atomic percent. In embodiments where the antiferromagnetic layer 12 comprises a PdPtMn alloy, the alloy may have a platinum content in the range of approximately 10-30 atomic percent and a palladium content in the range of approximately 10-30 atomic percent. In embodiments including an IrMn alloy, the alloy may have a manganese content in the range of approximately 45-85 atomic percent, or even approximately 70-80 atomic percent. The antiferromagnetic layer 12 may have a thickness in the range of approximately 100-300 Å. In other embodiments, the antiferromagnetic layer 12 may have a thickness in the range of approximately 120-250 Å, approximately 30-100 Å, or even approximately 40-80 Å.

In some embodiments, the interfacial layer 14 comprises platinum (Pt), tantalum (Ta), iridium (Ir), chromium (Cr), hafnium (Hf), palladium (Pd), tungsten (W), copper (Cu), or combinations thereof. In other embodiments, the interfacial layer 14 may comprise alloys of one or more of platinum (Pt), tantalum (Ta), tungsten (W), chromium (Cr), palladium (Pd), or copper (Cu). In other embodiments, the interfacial layer 14 may comprise alloys including one or more of bismuth (Bi) or selenium (Se). The interfacial layer 14 may have a thickness in the range of approximately 2-30 Å, approximately 4-15 Å, or even approximately 6-10 Å. The bilayer may be formed by any methods currently known or developed in the future, including but not limited to, sputtering and other deposition methods.

In some embodiments, rather than forming the SOT switching line 10 by depositing antiferromagnetic layer 12 (comprising, for example, one of FeMn, PtMn, IrMn, PdMn, PtPdMn, or NiMn) and interfacial layer 14 (for example, comprising, one or more of platinum (Pt), palladium (Pd), chromium (Cr), tantalum (Ta), Tungsten (W), copper (Cu), or combinations thereof) as two separate layers one atop the other, an SOT switching line where the material composition varies across its thickness (e.g., from its surface that forms an interface with "free" region 20 to the opposite surface) (hereinafter referred to as gradient composition) may be used. FIG. 2B illustrates magnetoresistive stack 400 (described previously with reference to FIG. 1A) with an SOT switching line 10 having a gradient composition. Since details of the magnetoresistive stack 400 were previously described with reference to FIG. 1A, they will not be described again. With reference to FIG. 2B, the SOT switching line 10 (of gradient composition) may comprise one or more alloys where each alloy comprises one or more metals or metalloids. The concentration of one alloy or metal at one edge of the SOT switching line 10 may be different than the concentration of that alloy or metal at the opposing edge of the SOT switching line 10. For example, by way of illustration and not limitation, the SOT switching line 10 may comprise a PtMn alloy where the edge of the SOT switching line 10 in contact with the "free" region 20 may have a higher concentration of platinum (Pt) than the average platinum content of the SOT switching line 10 as a whole to, e.g., improve SOT switching efficiency. Similarly, in this example, the edge of the SOT switching line 10 opposite from the surface in contact with the "free" region 20 would have a higher concentration of manganese (Mn) than the average manganese (Mn) content of the SOT switching line 10 as a whole to, e.g., generate a sufficient large bias magnetic field. The concentration of both components of the alloy varies on a gradient in a direction perpendicular to the interface of the "free" region 20 and the SOT switching line 10. The concentration of component alloys may vary linearly along a thickness of the SOT switching line 10. In other embodiments, the concentration of components in the alloy may vary in a non-linear fashion along the thickness of the SOT switching line 10. In one or more embodiments, the composition gradient may remain constant across the length and width of the SOT switching line 10. In other embodiments, the composition gradient may vary as a function of the length or width of the SOT switching line 10. In still other embodiments, an SOT switching line may comprise segments with a constant composition gradient and other segments with a varying composition gradient.

The SOT switching line 10 with a composition that varies on a gradient in a direction perpendicular to the interface of the "free" region 20 and the SOT switching line 10, as shown in FIG. 2B may be produced by any method currently known or developed in the future including sputtering or other physical deposition techniques. In at least one embodiment, the SOT switching line 10 of the present disclosure is produced by physical vapor deposition (such as ion-beam sputtering or magnetron sputtering). In these embodiments, by varying the angle between substrate and the alloyed (e.g., a PtMn alloy) target, the energy of the ion beam, the power to the target, or a combination thereof, the relative concentrations of atoms deposited on the substrate from the target will vary. So, for example, using an alloy target, by varying the angle at which atoms sputtered from the alloyed target contact the substrate, the composition of metals within the alloy deposited on the substrate will change. By varying the angle between the substrate and target during the sputtering process, an alloy layer with a gradient composition (e.g., an SOT switching line 10 according to FIG. 2B) can be produced onto the substrate. In other embodiments, co-sputtering can be used to produce a gradient composition SOT switching line 10 as shown in FIG. 2B. In a co-sputtering process, two target metals simultaneously undergo bombardment from the sputtering gas or ion beam source. By altering the power used on each target metal, the rate and hence the composition of each target being deposited onto the substrate can be varied.

Referring now to FIG. 3, in some embodiments, a magnetoresistive stack 450 may include a superficial layer 19. Superficial layer 19 may be formed above the SOT switching line 10. In some embodiments, superficial layer 19 may be formed below "free" region 20. In at least one embodiment, such as the one shown in FIG. 3, superficial layer 19 may be in contact with SOT switching line 10 and "free" region 20. In some magnetoresistive stacks, especially those involving oxide layers, high annealing temperatures (e.g., annealing temperatures greater than 350° C.) can cause a decrease in the magnetic moment of "free" region 20 in the magnetoresistive stack. In some embodiments, at least a portion of SOT switching line 10 may comprise beta-phase tungsten ((3-W). In one or more embodiments, the inclusion of a superficial layer 19, improves the thermally stability of the magnetoresistive stack 100, 200, 300, 400, 450 and thereby maintains small (or less) reduction in the magnetic moment of "free" region 20 in the stack under high annealing temperatures.

In general, superficial layer 19 may be formed on or above SOT switching line 10 using any technique now known (e.g., deposition, sputtering, evaporation, etc.) or later developed. In some embodiments, superficial layer 19 may be formed by one or more iterations of a deposition step followed by an oxidation step. In some embodiments, superficial layer 19 may include hafnium (Hf), tungsten (W), molybdenum (Mo), tantalum (Ta), platinum (Pt), vanadium (V), zirconium (Zr), iron (Fe), cobalt (Co), magnesium (Mg), or combinations, alloys, and oxides thereof. Superficial layer 19 may have any suitable thickness, such as a thickness less than or equal to 10 Å, preferably less than or equal to 5 Å For example, superficial layer 19 may have a thickness of about 0.5 Å to about 10 Å (e.g., 0.5 Å, 1 Å, 1.5 Å, 2 Å, 2.5 Å, 3 Å, 3.5 Å, 4 Å, 4.5 Å, A, 6 Å, 7 Å, 8 Å, 9 Å, or 10 Å). In some embodiments, superficial layer 19 may be formed from non-magnetic material. When superficial layer 19 is formed from non-magnetic material, for example, halfnium (Hf), tungsten (W), molybdenum (Mo), tantalum (Ta), platinum (Pt), vanadium (V), zirconium (Zr), magnesium (Mg), or combinations, alloys, and oxides thereof, superficial layer 19 may have the same (or similar) demission as that of SOT switching line 10 shown in FIG. 2A.

As described previously, superficial layer 19 may improve the thermal stability of a magnetoresistive stack 450 and may thereby lead to small (or less) reduction in the magnetic moment of a "free" region (e.g., "free" region 20) in the stack at high annealing temperatures (e.g., annealing temperatures greater than 350° C.). Six magnetoresistive stacks were prepared including an SOT switching line 10 comprising beta-phase tungsten ((3-W). Five of the six magnetoresistive stacks 450 included a superficial layer 19 comprising halfnium (Hf) disposed between the SOT switching line 10 and the "free" region 20, where each of the five stacks had a superficial layer 19 of a different thickness. A sixth magnetoresistive stack had no superficial layer 19 (i.e., a superficial layer 19 thickness of 0 Å). FIG. 4 shows a plot of the normalized magnetic moment of the "free" region in the six exemplary magnetoresistive stacks as related to annealing temperature. The magnetoresistive stack without a superficial layer 19 (marked by the open circle data points connected by the solid line), showed a significant decrease in the normalized magnetic moment of the "free" region at annealing temperatures greater than 350° C. As can be seen in FIG. 4, each magnetoresistive stack 450 with a superficial layer 19, showed an improved normalized magnetic moment, as compared to the magnetoresistive stack without the superficial layer 19.

The magnetoresistive stacks 100, 200, 300, 400, 450 shown in FIGS. 1A-3 are exemplary, and are not an exhaustive listing of all magnetoresistive stacks that are compatible with the SOT switching line 10 geometries and compositions described herein. Any magnetoresistive stacks may be used in conjunction with the SOT switching line 10 geometries and compositions described in the current disclosure, such as, for example, magnetoresistive stacks known in the art or described in U.S. Provisional Patent Application Nos. 62/571,807; 62/593,343; and 62/653,796, all of which are incorporated by reference in their entireties.

FIG. 5 depicts a flow chart of an exemplary method 500 of fabricating an exemplary magnetoresistive stack 100, 200, 300, 400, 450 according to the present disclosure. In the discussion below, reference will be made to the reference numerals detailed in FIGS. 1A-3. An SOT switching line 10 may be formed by any suitable process described herein (step 510). In some embodiments, formation of the SOT switching line 10 may include providing an additional layer, for example, interfacial layer 14 or superficial layer 19. A "free" region 20 may then be formed adjacent (e.g., on or above) an exposed surface of the SOT switching line 10 (step 520). In some embodiments, the "free" region 20 may be formed by providing (e.g., sequentially) the different layers (e.g. layers 22, 24, 26) that comprise the "free" region 20 on the exposed surface of the SOT switching line 10. In some embodiments, the "free" region 20 may include providing an additional layer, for example, superficial layer 19. An intermediate region 30 may then be formed adjacent (e.g., on or above) an exposed surface of the "free" region 20 (step 530). A "fixed" region 40 may then be formed adjacent (e.g., on or above) an exposed surface of the intermediate region 30 (step 540). In some embodiments, the "fixed" region 40 may be formed by providing (e.g., sequentially) the different layers (e.g., layers 42, 44, 46) that comprise the "fixed" region 40 on the exposed surface of the intermediate region 30.

As alluded to above, magnetoresistive stack (e.g., stack 100, 200, 300, 400, 450) may be implemented in a sensor architecture or a memory architecture (among other architectures). For example, in a memory configuration, the magnetoresistive stack (e.g., stack 100, 200, 300, 400, 450) may be electrically connected to an access transistor and configured to couple or connect to various conductors, which may carry one or more control signals, as shown in FIG. 6. The magnetoresistive stack of the current disclosure (e.g., stacks 100, 200, 300, 400, 450) may be used in any suitable application, including, e.g., in a memory configuration. In such instances, the magnetoresistive stack may be formed as an integrated circuit comprising a discrete memory device (e.g., as shown in FIG. 7A) or an embedded memory device having a logic therein (e.g., as shown in FIG. 7B), each including MRAM, which, in one embodiment is representative of one or more arrays of MRAM having a plurality of magnetoresistive stacks, according to certain aspects of certain embodiments disclosed herein.

Any suitable method may be used to form the different regions of the magnetoresistive stacks described herein. Since suitable integrated circuit fabrication techniques (e.g., deposition, sputtering, evaporation, plating, etc.) that may be used to form the different regions are known to those of ordinary skill in the art, they are not described here in great detail. In some embodiments, forming some of the regions may involve thin-film deposition processes, including, but not limited to, physical vapor deposition techniques such as ion beam sputtering and magnetron sputtering. And, forming thin insulating layers (e.g., the intermediate region 30, which may form a tunnel barrier) may involve physical vapor deposition from an oxide target, such as by radio-frequency (RF) sputtering, or by deposition of a thin metallic film followed by an oxidation step, such as oxygen plasma oxidation, oxygen radical oxidation, or natural oxidation by exposure to a low-pressure oxygen environment.

In some embodiments, formation of some or all of the regions of the described magnetoresistive stacks (e.g., magnetoresistive stack 100) may also involve known processing steps such as, for example, selective deposition, photolithography processing, etching, etc., in accordance with any of the various conventional techniques known in the semiconductor industry. In some embodiments, during deposition of the disclosed "fixed" and "free" regions, a magnetic field may be provided to set a preferred easy magnetic axis of the region (e.g., via induced anisotropy). Similarly, a strong magnetic field applied during the post-deposition high-temperature anneal step may be used to induce a preferred easy magnetic axis and a preferred pinning direction for any antiferromagnetically pinned materials.

Although various embodiments of the present disclosure have been illustrated and described in detail, it will be readily apparent to those skilled in the art that various modifications may be made without departing from the present disclosure.

What is claimed is:

1. A magnetoresistive device comprising:
    a fixed region having a fixed magnetic state;
    a free region having a magnetic state, where the magnetic state of the free region stores a first value when in a first magnetic state and stores a second value when in a second magnetic state;
    a dielectric layer between the free region and the fixed region;
    a spin orbit torque (SOT) segment in contact with at least a portion of the free region, wherein current through the SOT segment generates spin current in a direction perpendicular to the current through the SOT segment and perpendicular to a plane between the SOT segment and the free region.

2. The device of claim 1, wherein the SOT segment is configured to allow current to pass bidirectionally though the SOT segment.

3. The device of claim 2, wherein a current flowing in a first direction through the SOT segment forces the magnetic state of the free region to the first magnetic state, and wherein a current in a second direction forces the magnetic state of the free region to the second magnetic state.

4. The device of claim 1, wherein the SOT segment comprises iridium, palladium, platinum, hafnium, chromium, copper, gold, tantalum, tungsten, gadolinium, or combinations thereof.

5. The device of claim 1, wherein the SOT segment has a thickness of about 30 Å to about 130 Å.

6. The device of claim 1, wherein the SOT segment comprises an antiferromagnetic layer and an interfacial layer.

7. The device of claim 1, wherein the SOT segment comprises a manganese alloy.

8. The device of claim 7, wherein the concentration of manganese in the SOT segment varies as a function of distance from the free region.

9. The device of claim 8, wherein a manganese concentration of the SOT segment at an interface of the SOT segment and the free region is less than an average manganese concentration of the SOT segment.

10. The device of claim 6, wherein the antiferromagnetic layer comprises a manganese alloy including one or more of palladium, platinum, iridium, iron, or nickel; and
    the interfacial layer comprises platinum, tantalum, iridium, chromium, hafnium, palladium, tungsten, vanadium, zirconium, copper, or a combination thereof.

11. The device of claim 10, wherein the manganese alloy has a manganese content of about 45 atomic percent to about 85 atomic percent.

12. The device of claim 6, wherein the antiferromagnetic layer has a thickness of about 30 Å to about 100 Å; or
    the interfacial layer has a thickness of about 2 Å to about 30 Å.

13. A magnetoresistive device comprising:
    a fixed region having a fixed magnetic state;
    a free region having a magnetic state, where the magnetic state of the free region stores a first value when in a first magnetic state and stores a second value when in a second magnetic state;

a dielectric layer between the free region and the fixed region;

a spin-orbit torque (SOT) segment disposed on a side of the free region opposite the dielectric layer;

wherein the SOT segment comprises an antiferromagnetic layer and an interfacial layer.

14. The device of claim 13, wherein current through the SOT segment generates spin current in a direction perpendicular to the current through the SOT segment and perpendicular to a plane between the SOT segment and the free region.

15. The device of claim 13, wherein the antiferromagnetic layer comprises a manganese alloy including one or more of palladium, platinum, iridium, iron, or nickel, and the manganese alloy has a manganese content of about 45 atomic percent to about 85 atomic percent.

16. The device of claim 13, wherein the antiferromagnetic layer has a thickness of about 30 Å to about 100 Å.

17. The device of claim 13, wherein the interfacial layer comprises platinum, tantalum, iridium, chromium, hafnium, palladium, tungsten, vanadium, zirconium, copper, or a combination thereof.

18. The device of claim 13, wherein the interfacial layer has a thickness of about 2 Å to about 30 Å.

19. The device of claim 13, wherein a current flowing in a first direction through the SOT segment forces the magnetic state of the free region to the first magnetic state, and wherein a current in a second direction forces the magnetic state of the free region to the second magnetic state.

20. The device of claim 13, wherein the SOT segment comprises beta-phase tungsten.

* * * * *